United States Patent [19]

Vai et al.

[11] Patent Number: 5,231,362
[45] Date of Patent: Jul. 27, 1993

[54] CIRCUIT DEVICE FOR PHASING AN OSCILLATOR

[75] Inventors: Gianfranco Vai, Pavia; Maurizio Zuffada, Milan; Fabrizio Sacchi, Pavia; David Moloney, Cornaredo; Giorgio Betti, Milan, all of Italy

[73] Assignee: SGS-Thomson Microelectronics S.r.L., Milan, Italy

[21] Appl. No.: 813,155

[22] Filed: Dec. 23, 1991

[30] Foreign Application Priority Data

Dec. 28, 1990 [IT] Italy ............................. 22550 A/90

[51] Int. Cl.$^5$ .................... H03B 5/06; H03B 5/24; H03K 3/282
[52] U.S. Cl. .................... 331/113 R; 331/144; 331/172
[58] Field of Search .................. 331/113 R, 144, 145, 331/172; 307/269

[56] References Cited

U.S. PATENT DOCUMENTS 4,496,914 1/1985 Andresen et al. ............... 331/113 R Primary Examiner—Davis Mis
Attorney, Agent, or Firm—Rosen, Dainow & Jacobs

[57] ABSTRACT

A circuit device for phasing an oscillator, which comprises a multivibrator having a transistor pair with the emitters coupled through a capacitor, comprises a normally open electronic switch controlled by a drive signal to close and inhibit the oscillator. This switch connects a voltage divider to the base of a transistor connected to one of the emitters to interrupt the loop positive feedback of the oscillator upon the voltage across the capacitor reaching a predetermined value.

9 Claims, 3 Drawing Sheets

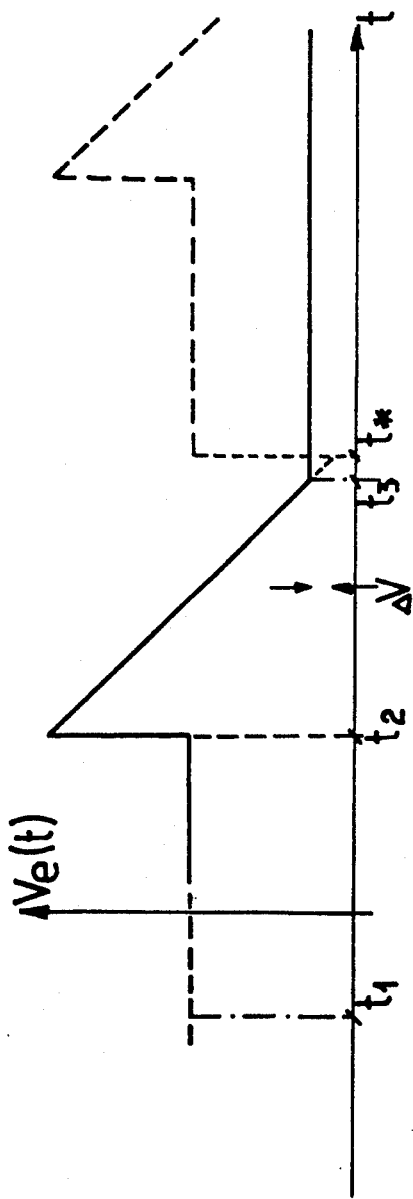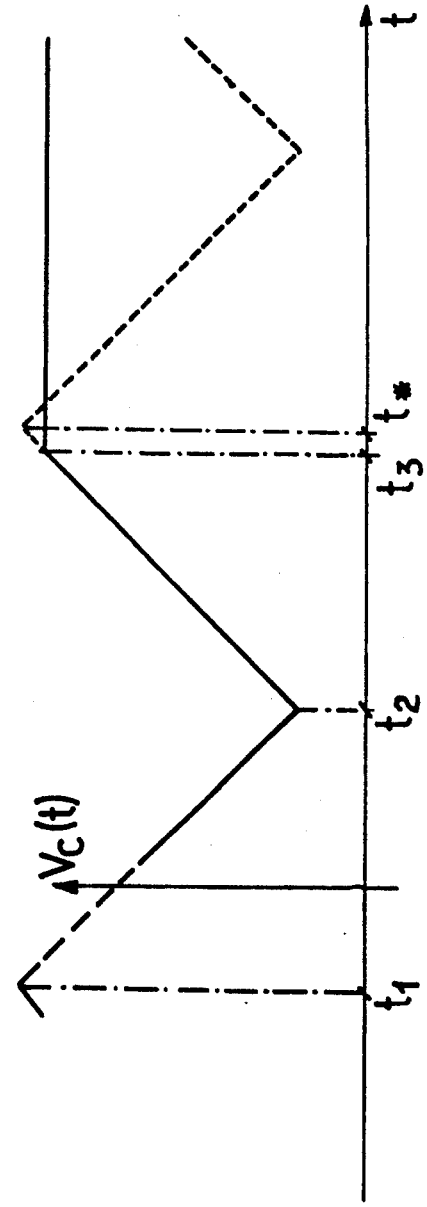

CIRCUIT DEVICE FOR PHASING AN OSCILLATOR

BACKGROUND OF THE INVENTION

1. Field of the Invention

This invention relates to a circuit device for phasing an oscillator, which comprises a multivibrator having a transistor pair with their emitters coupled through a capacitor.

2. Description of Related Art

Voltage-controlled oscillators, or VCO's, are widely employed in a number of electronic apparatus, particularly for modulating and de-modulating RF signals.

In most instances, such oscillators are implemented, as integrated circuits, with RC multivibrators wherein the capacitor charge current is varied in response to a control pulse.

A typical example of a device of this kind is described, for example, in "Analysis and Design of Analog Integrated Circuits", pages 590–593, published by Wiley, 1977.

A requisite with such devices is an ability to stop the oscillation at a selected time, to then re-start it in a known pre-determined state of phasing.

No prior art approach has been known which can fill this demand.

SUMMARY OF THE INVENTION

The underlying technical problem of this invention is to provide a circuit device which has such structural and functional features as to allow the oscillator to be temporarily blocked and then re-started in a predetermined phase condition.

The solution idea on which this invention stands is one of associating a circuit portion with the oscillator which can interrupt the positive feedback signal in the oscillator upon the voltage across the capacitor incorporated thereto reaching a pre-determined value.

The technical problem is solved by a circuit device as defined and generally characterized in the first of the claim appended to this specification.

The features and advantages of a device according to the invention will become more clearly apparent from the following detailed description of an embodiment thereof, given by way of example and not of limitation with reference to the accompanying drawings.

BRIEF DESCRIPTION OF THE DRAWINGS

In the drawings:

FIG. 3 and 4 are respective waveform diagrams of signals present in the inventive device.

DESCRIPTION OF THE PREFERRED EMBODIMENT

Figure 1:
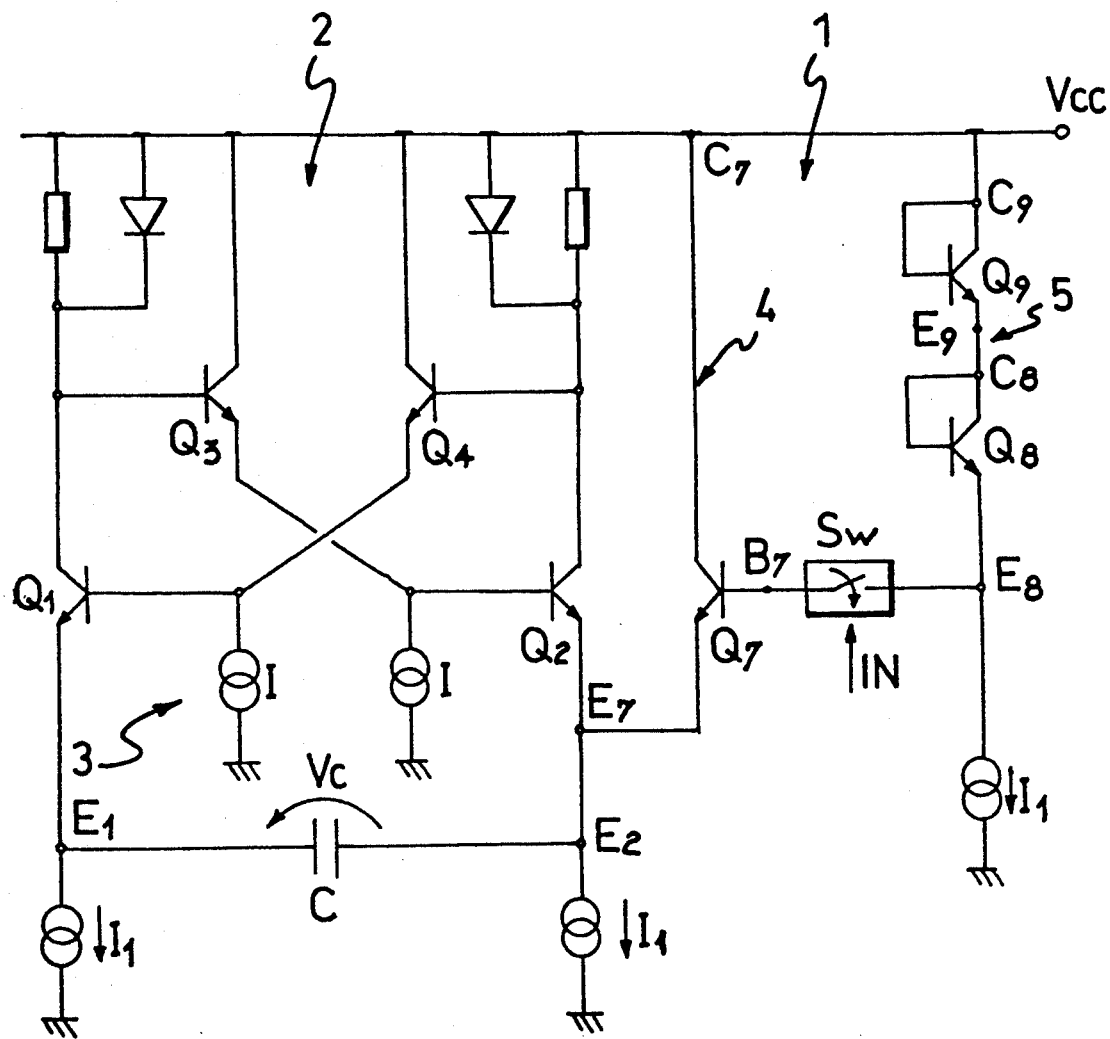
FIG. 1 is a diagrammatic representation in principle of the circuit device according to this invention.

With reference to the drawing figures, generally and schematically shown at 1 is a circuit device embodying this invention and being intended for phasing an oscillator 2.

The oscillator 2 is of the VCO (Voltage-Controlled Oscillator) type and conventional construction, it comprising a multivibrator 3 which includes a pair of transistors Q1, Q2 whose emitters E1, E2 are coupled together through a capacitor C which establishes a positive feedback path between the two transistors. An example of such an oscillator 2 is describe don page 592 of the book "Analysis and Design of Analog Integrated Circuits, published by Wiley, 1977.

The oscillator transistors Q1, Q2 are driven by corresponding transistors Q3, Q4 which are connected as emitter followers between a positive supply pole Vcc and two current sources I identical with each other.

The device 1 of this invention is implemented as a circuit portion associated with the oscillator and comprises a first leg 4 with a bipolar transistor Q7 of the non type having its collector C7 connected to the positive pole Vcc and its emitter E7 connected to the emitter E2 of the oscillator transistor Q2.

A second circuit leg 5 comprises a series of two bipolar transistors Q8, Q9 connected, in a diode configuration between the positive pole Vcc and a current source I1 to provide substantially a division of voltage Vcc. The collector C8 of transistor Q8 is connected to the emitter E9 of transistor Q9 having its collector C9 connected to the pole Vcc.

The emitter E8 of transistor Q8 is connected to the source I1, as well as to the base B7 of transistor Q7, through a normally open electronic switch SW which has a control terminal adapted to receive a make drive signal IN for inhibiting operation of the oscillator upon the voltage across the capacitor C reaching a predetermined value.

The operation of the circuit device according to the invention will be now described with reference to a starting condition wherein the oscillator 2 is in a state of discharge of capacitor C as shown in FIG. 3 by the broken line segment included between the times t1 and t2.

Shown in FIG. 3 is a graph of the voltage value Vc(t) across the capacitor C versus time. Denoted by t1, t2 and t3 are the times when the charge of the capacitor C undergoes switching.

Where the signal IN on the switch SW input is activated at a time within the t1 to t2 range, the oscillator 2 would be in a condition wherein transistor Q1 is off, while Q2 is on. Consequently, transistor Q7 of the device 1 would be held off because of its base B7 being at a lower voltage value than the base of transistor Q2.

In such a circumstance, the oscillator 2 would keep operating normally as specified.

Where, on the other hand, the signal IN is received within the t2 and t3 range, transistor Q1 would be active and the other transistor, Q2, cut off, with the voltage on the emitter E2 decreasing with a derivative of I1/C.

By making the emitter area of transistor Q7 larger than the emitter area of transistor Q2, transistor Q7 is turned on at time t3, that is before the voltage on the emitter E2 reaching, at time t*, a value which enables Q2 to be turned on.

From time t3 onwards, therefore, Q2 is prevented from being turned on by breaking the positive feedback loop between the transistor Q1 and Q2.

This situation is depicted diagrammatically in FIG. 4, showing the segmental waveform of the voltage Ve(t) on the emitter E2, with the same time base of the voltage Vc(t) on the capacitor C as shown in FIG. 3.

If the area occupied in the integrated circuit by transistor Q7 is denoted by A', and the area occupied by each of transistors Q1 and Q2 is denoted by A, then the difference between the turn-on voltage of transistor Q7 and that of transistor Q2 can be obtained form the following formula:

$$\Delta V = Vt + \ln A'/A$$

where Vt is the voltage value tied to thermal drift.

It may be appreciated that, the moment the signal IN is cancelled, thereby removing the block on the oscillator 2, the voltage on the emitter 62 is bound to further drop by $\Delta V$ before transistor Q2 can be turned on again, which inevitably involves a time delay for phasing the oscillator.

In order to minimize this time delay equal to $$t^* - t3 = \Delta t = \Delta V \cdot C/I$$

it becomes convenient to compute the percent value of the delay with respect to the oscillation period T.

In our case, the period T is obtained from the following formula:

$$1/T = I/4 \cdot C \cdot Vbe$$

where Vbe is the base-emitter voltage of transistor Q2.

Thus, the following relation is arrived at:

$$\Delta t/T = \Delta V/4 \cdot Vbe = (Vt \cdot \ln A'/A)/4 \cdot Vbe$$

which, with Vbe=0.7 V, Vt=26 mV, and A'/A=1.5, yields $\Delta t/T = 0.004$, the equivalent of a phase error of 0.025 radians, which is independent, however, of the device thermal drift.

Since Vbe=Vt*lnI/Is, the above relation will be independent of Vt, which is the signal temperature-dependent term.

The foregoing formulae lead to conclude that the phase error can be reduced by decreasing the value of the A'/A ratio to the point that, should that ratio equal one, no delay would occur in re-starting and phasing the oscillator further to switching the switch SW.

However, it would be unwise to reduce the A'/A ratio of the areas down to unit if uncontrolled re-starting of the oscillator is to be avoided.

Figure 2:
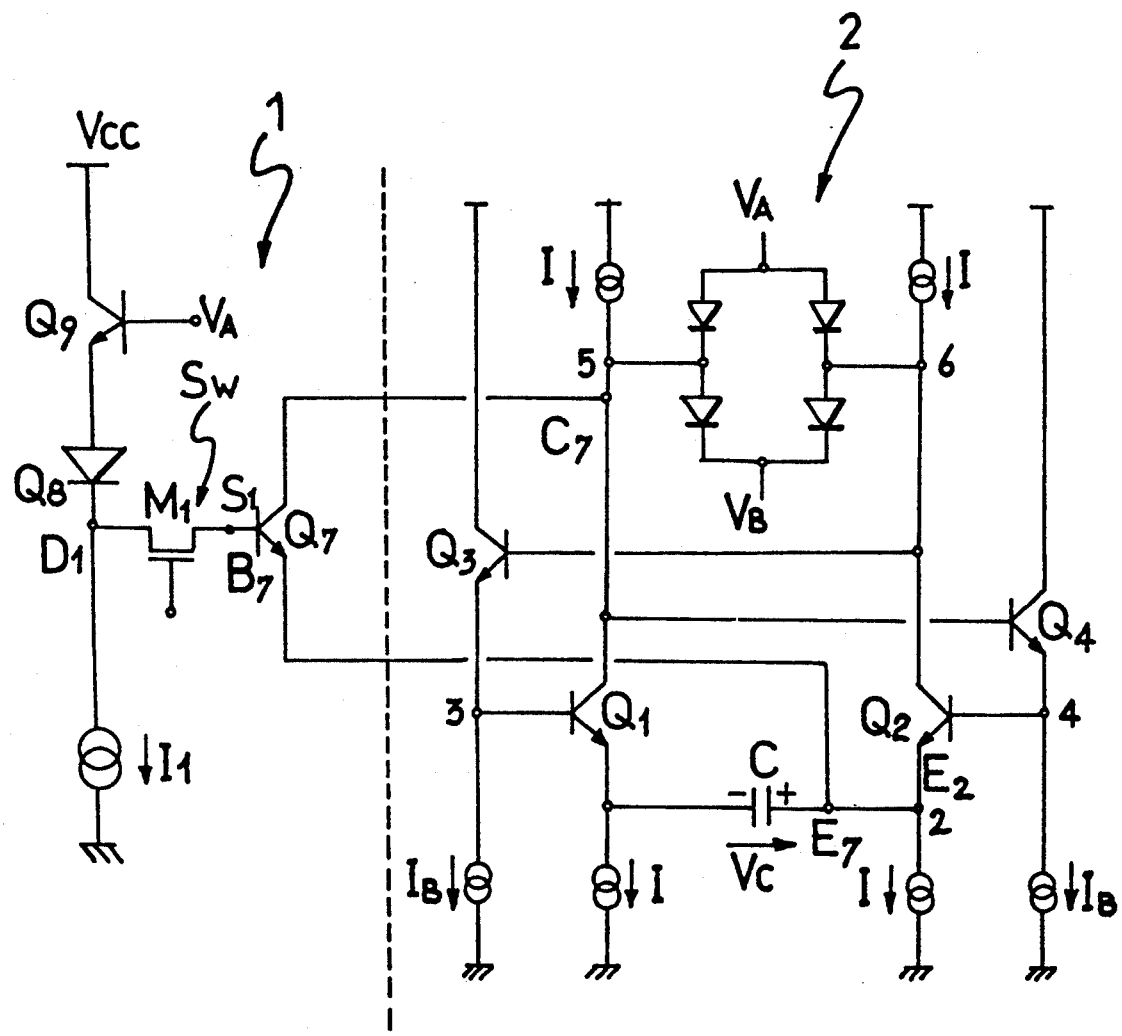
FIG. 2 is a further diagrammatic representation of a preferred embodiment of the device shown in FIG. 1.

In a preferred embodiment, shown in FIG. 2, the switch SW is comprised of a field effect transistor M1 of the MOS type. This transistor M1 is connected in the device with its source S1 connected to the base of transistor Q7, and its drain D1 associated with the voltage divider consisting of the diode-transistors Q8 and Q9.

Understandably, proper sizing of the circuit requires that the internal voltage drop across the transistor M1 be taken into account.

The device of this invention also affords the advantage that it does not interfere with the normal operation of the oscillator whenever its intervention is not required.

We claim:

1. A circuit device for phasing an oscillator, which comprises a multivibrator having a pair of bipolar transistors with their emitters coupled through a feedback path including a capacitive means, characterized in that it comprises an electronic switch having a control terminal adapted to receive an oscillator inhibit signal and circuit means connected to the oscillator and responsive to the state of the electronic switch to de-activate the emitter coupling of the transistor pair upon an inhibit signal being applied to the control terminal of the electronic switch and the voltage across the capacitive means attaining a predetermined value.

2. A device according to claim 1, characterized in that the electronic switch is normally open and the circuit means comprise a transistor connected between one of the emitters of the transistor pair and a supply pole for the device, and has a control terminal connected serially to the electronic switch.

3. A device according to claim 2, characterized in that said circuit means comprise a voltage divider connected to the control terminal of the transistor through the electronic switch.

4. A device according to claim 3, characterized in that said voltage divider comprises a series of diodes connected between a positive supply pole and a grounded current source.

5. A device according to claim 4, characterized in that said series of diodes is comprised of a transistor pair in a diode configuration.

6. A device according to claim 2, characterized in that said transistor is of the bipolar type with the collector connected to a supply pole, the emitter connected to said emitter of the transistor pair, and the base connected to the switch.

7. A device according to claim 6, characterized in that said bipolar transistor is arranged to have a larger emitter area than the emitter area of the transistor in the transistor pair whereto it is connected.

8. A device according to claim 1, characterized in that said electronic switch is a field effect transistor of the MOS type.

9. A device according to claim 2, characterized in that said electronic switch is a field effect transistor of the MOS type having its source connected to the control terminal of said transistor.

* * * * *